United States Patent
Wakamiya et al.

(10) Patent No.: US 6,250,822 B1
(45) Date of Patent: Jun. 26, 2001

(54) SEMICONDUCTOR WAFER MANUFACTURING METHOD AND APPARATUS FOR AN IMPROVED HEAT EXCHANGER FOR A PHOTORESIST DEVELOPER

(75) Inventors: Ted Wakamiya, San Ramon; Eric Kent, San Jose; Vincent L. Marinaro, Sunnyvale, all of CA (US)

(73) Assignee: Advanced Micro Device, Inc., Sunnyvale, CA (US)

( * ) Notice: Subject to any disclaimer, the term of this patent is extended or adjusted under 35 U.S.C. 154(b) by 0 days.

(21) Appl. No.: 09/498,196

(22) Filed: Feb. 4, 2000

(51) Int. Cl.[7] .............................. G03D 5/00; G03D 13/00
(52) U.S. Cl. ............................................ 396/576; 611/626
(58) Field of Search .................................. 396/604, 611, 396/626, 627, 576; 118/52, 319, 320, 500, 666–668, 712; 134/2, 3, 24, 33, 144, 153, 402; 438/713; 430/322, 325, 330, 311, 312, 396; 427/240, 425

(56) References Cited

U.S. PATENT DOCUMENTS 5,374,312 * 12/1994 Hasebe et al. ........................ 118/52
5,960,225 * 9/1999 Fujimoto .............................. 396/611

FOREIGN PATENT DOCUMENTS 63-051975 * 3/1988 (JP) .
10-303100 * 11/1998 (JP) .

* cited by examiner

Primary Examiner—D. Rutledge
(74) Attorney, Agent, or Firm—Foley & Lardner (57) ABSTRACT

Embodiments of the invention comprise a new device and technique to realize an improved temperature control for a chemical photoresist developer utilizing a preexisting integrated single reservoir. This improvement is achieved by providing for a modified temperature control unit and procedure. The temperature control unit preferably comprises a plurality of heat exchanger conduits that are each supplied by an inlet manifold, and then exhausted via an outlet manifold. The temperature control unit preferably extends fully within the modified nozzle unit. By utilizing the improved temperature control unit, a first and second volumetric allocation of developer may be issued so that both may be dispensed within a relatively short period of time upon a photoresist layer surface in a temperature controlled state.

21 Claims, 6 Drawing Sheets

SEMICONDUCTOR WAFER MANUFACTURING METHOD AND APPARATUS FOR AN IMPROVED HEAT EXCHANGER FOR A PHOTORESIST DEVELOPER

CROSS-REFERENCE TO RELATED APPLICATIONS

The present application is related to the following commonly assigned applications filed concurrently herewith: "Semiconductor Wafer Manufacturing Method and Apparatus To Improve A Developer Temperature Profile", Application No. 09/498,573; and "Semiconductor Wafer Manufacturing Method and Apparatus To Improve A Developer Temperature Profile Utilizing An Improved Heat Exchanger For An Improved Developer Temperature Profile Photoresist Developer", Application No. 09/498,118.

BACKGROUND OF THE INVENTION

The present invention relates generally to a method and apparatus for manufacturing a semiconductor integrated circuit ("IC"). More specifically, this invention relates to an improved method and apparatus for the dispensing of a plurality of allocations of a photoresist developer while maintaining an improved temperature profile.

DESCRIPTION OF THE PRIOR ART

The present invention applies particularly to the fabrication of semiconductor integrated circuits. Some examples of these semiconductor integrated circuits comprise non-volatile memory integrated circuits. Non-volatile memory integrated circuits include an EPROM, an EEPROM, a flash memory device, and a complementary metal oxide silicon ("CMOS") type device. Exemplary devices may comprise field-effect transistors ("FET") containing a metal gate over thermal oxide over silicon ("MOSFET"), as well as other ultra-large-scale integrated-circuit ("ULSI") systems.

Integrated circuits are utilized in a wide variety of commercial and military electronic devices, including, e.g., hand held telephones, radios and digital cameras. The market for these electronic devices continues to demand devices with a lower voltage, a lower power consumption and a decreased chip size. Also, the demand for greater functionality is driving the "design rule" lower, for example, into the sub-half micron range. The sub-half micron range may comprise, e.g., decreasing from a 0.35–0.25 micron technology to a 0.18 micron or a 0.15 micron technology, or even lower.

These integrated circuit devices are generally fabricated in groups on a semiconductor wafer. A portion of this fabrication involves utilizing a photolithography process to pattern the semiconductor wafer. This photolithography process is conventionally utilized in a semiconductor wafer production.

Specifically, in a portion of the photolithography of these wafers, a photoresist coater and developer system is utilized in the patterning of various layers of the wafer that will form the circuit device. The photoresist coater and developer system applies, or coats, a light-sensitive resin, i.e., a photoresist layer, to wafers by depositing a pre-selected amount of the photoresist solution. Next, the system spins the wafers at a relatively high rate of speed to distribute the photoresist into a relatively even coating over the wafer. Then, the wafers are baked to induce a volatilization of a casting solvent in the photoresist. Next, the wafers are exposed to a light source, e.g., a deep ultraviolet ("DUV") light source, for patterning. The exposed wafers are baked and then developed by a chemical treatment, and are again baked to dry the wafers.

Conventional examples of resist coater and developer systems, e.g., are the Tokyo Electron Limited (TEL) sub-half micron compatible Coater/Developer Clean Track systems. Conventional systems include systems that utilize a chemically amplified resist ("CAR") in the deep ultraviolet ("DUV") process that has been adopted for the sub-half micron design rule type of circuit devices.

As to the development of the photoresist that has been formed on the wafer, conventionally, a chemical developer is utilized to remove areas defined in the steps of masking and exposure of the photoresist layer that has been deposited on the wafer. The development of the photoresist is an important part of the wafer fabrication.

For example, in sub-half micron semiconductor processing, one of the most important parameters in the photolithography area is the critical dimension ("CD"). The above described relatively complex integrated circuits will only function as designed if the critical dimensions are within specification. There are many parameters that control the critical dimension. One of these parameters comprises the temperature of the photoresist chemical developer solution when the wafer is being developed.

Figure 1:
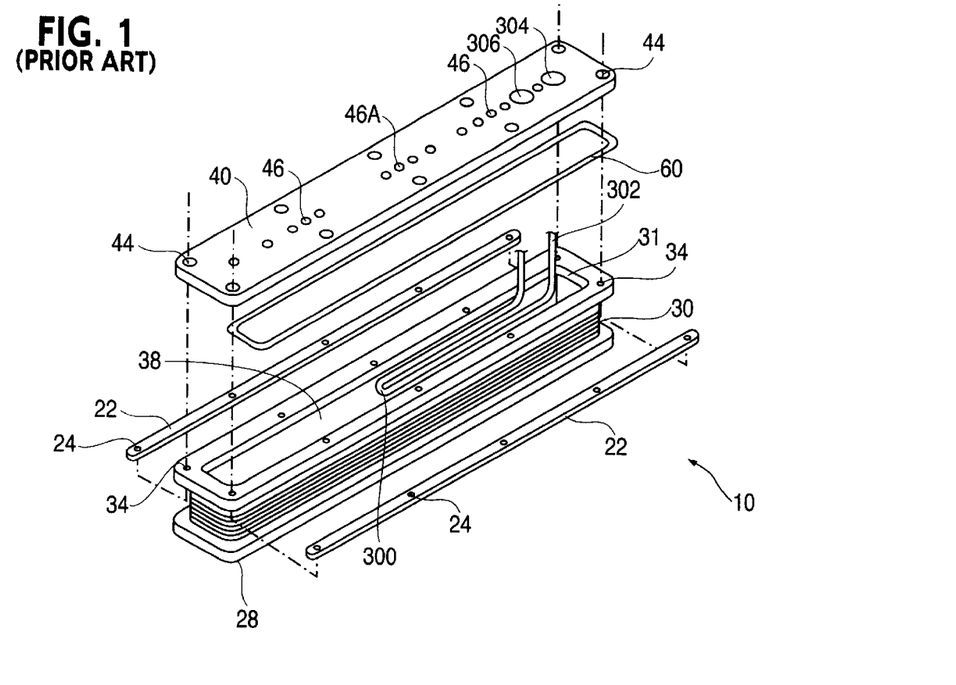
FIG. 1 illustrates an exploded view of a portion of a conventional nozzle that is utilized in the fabrication of an integrated circuit device.

FIG. 1 illustrates a conventional photoresist chemical developer solution dispensing apparatus, or nozzle assembly 10. The nozzle assembly 10 includes a nozzle unit 30 that is connected to a nozzle cap 40 by utilizing fastening devices, e.g., nuts and bolts, that are not shown. The fastening devices first pass through the fastening holes 24, starting from a lower surface of the nut plate 22, then through the fastening holes 34 of the nozzle unit 30, and finally through the fastening holes 44 of the nozzle cap 40. In order to seal the nozzle assembly 10, an O ring 60 is provided between the nozzle cap 40 and a top interior recessed groove 31 of the nozzle unit 30.

Although not shown, a plurality of nozzle ports 28 for dispensing a chemical developer solution are located on a lower portion or underside of the nozzle unit 30. The chemical developer is introduced into the nozzle assembly 10 through one or more input ports 46 of the nozzle cap 40.

A temperature control unit 300, that includes a heating coil comprising a single ⅜ inch diameter heat exchanger tube 302, is centrally placed within the nozzle unit interior 38. This heat exchanger tube 302 carries a temperature control liquid within an interior sealed portion of this heat exchanger tube 302. Suitable temperature control unit input and output ports 304, 306, are respectively provided to transport the temperature controlled fluid into the interior sealed portion of the heat exchanger tube 302. The conventional temperature control liquid then achieves a thermal equilibrium with the allocation of chemical developer that has just been introduced, via the input ports 46, into the nozzle unit interior 38 of the nozzle unit 30. Also provided is an air bleed port 46A that is routed to a drain and may be utilized when introducing the developer.

By providing this close physical association between the temperature control unit and the chemical developer nozzle ports 28, a relatively strict or precise temperature control of a single developer allocation is achieved. For example, the developer may be supplied to the nozzle unit interior 38 at a temperature that is approximately 2–5° C. different, e.g., lower, than the desired control temperature, e.g., of approximately 23° C. Also, the developer may be supplied to the nozzle unit interior 38 at a greater than 5° C. temperature difference than the desired control temperature. The temperature control of the chemical developer solution is provided until it is dispensed or deposited by the nozzle ports 28 onto the wafer 220, as is shown in FIGS. 2A–B.

Figure 2A:
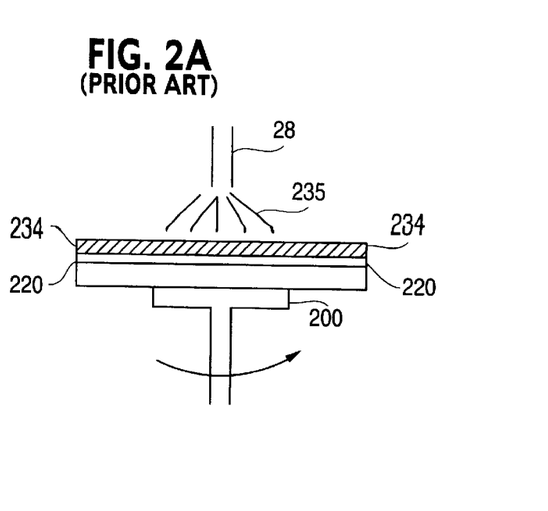
FIG. 2A illustrates a portion of a nozzle and wafer during a spray and rotation phase that is utilized in the fabrication of an integrated circuit device.

In FIG. 2A, a conventional photoresist coating and developing system is shown. FIGS. 2A–B illustrate a technique that is conventionally referred to as a puddle procedure.

Specifically, the puddle process comprises the following technique that is illustrated by a conventional single wafer spray unit. In FIG. 2A, the semiconductor wafer 220 is held upon a rotatable table or track chuck 200. First, the wafer 220 is spun utilizing the chuck 200. A first allocation of the photoresist developer 235 is dispensed through the nozzle ports 28 to an upper surface of the wafer 220 that further comprises a photoresist layer 234 that has been patterned and exposed by light. While the temperature controlled chemical developer 235 is being dispensed, the wafer 220 is spun at a relatively low number of revolutions per minute ("RPM"). The chemical developer 235 is now utilized to cure the photoresist.

Figure 2B:
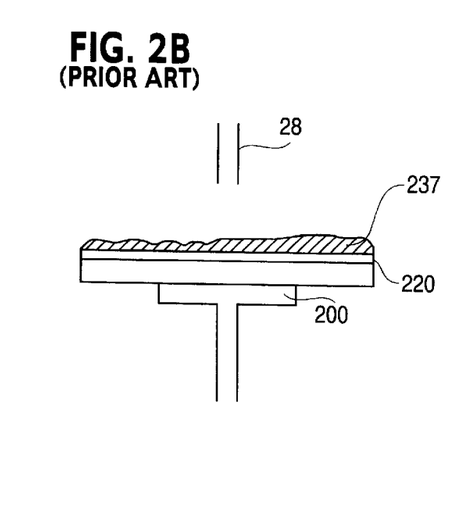
FIG. 2B illustrates a portion of a nozzle and wafer during a puddle phase that is utilized in the fabrication of an integrated circuit device.

The spinning of the wafer 220 is then stopped, as shown in FIG. 2B. The first allocation of the chemical developer 235 has been deposited by the nozzle ports 28 so as to cover the photoresist upper surface. Surface tension now holds the developer 235 on the wafer 220 so as to form a puddle 237. The puddle 237 of developer 235 then sits upon the surface of the wafer 220 for a specified or required period of time. For example, a specified sit time of 23 seconds may be utilized. Thus, in essence, this puddle technique provides for a single wafer topside-only immersion process.

When the specified sit time has expired, the wafer 220 is again spun at a relatively low RPM while a second allocation of the developer 235 is dispensed by the nozzle ports 28 onto the wafer 220. Again, the wafer spinning is stopped and is again allowed to sit with a puddle 237 of the second allocation of developer 235 on the top surface of the wafer 220, e.g., for a sit time of approximately another 23 seconds.

Finally, the wafer 220 is spun at a relatively high RPM while rinsing with water. After rinsing, the wafer 220 is dried and passed on to the next step. It is understood that the rinsing and drying portions of the developing process are not illustrated in FIGS. 2A–B. The next wafer is then processed through the development station.

The above first and second allocations and sit times of the developer 235 comprise a double puddle technique. Each new wafer is processed through this double puddle development in about 2.5 minutes. This allows enough time for the first allocation of developer 235 to reach thermal equilibrium with the heating unit in the nozzle unit 30, and thus achieve a temperature control of the developer prior to dispensation.

The conventional nozzle unit 30 temperature controls approximately 60 cubic centimeters (cc's) of developer at any given time, once the developer reaches thermal equilibrium with the heating unit. However, the first allocation of the dispensed temperature controlled chemical developer 235 utilizes approximately most or all of this 60 cc volume.

It takes approximately 1.5 seconds to dispense the approximately 60 cc's of chemical developer 235 solution through the nozzle ports 28 at the maximum rate. However, the delivery time span of this first allocation by the nozzle ports 28 varies, depending upon the process selected and the type of photoresist and/or developer utilized. A conventional developer delivery time span may occur over, e.g., about 1.5 to 3.5 seconds.

Conventionally, the second allocation of developer is then input through the input ports 46 to the nozzle unit interior 38 just after the dispensation of the first allocation of the chemical developer. Due to the time required for filling the nozzle unit interior 38 with the second allocation of developer there is even less time, than the approximately 23 seconds of sit time, for the second allocation of developer to attempt to reach a temperature controlled state. In fact, the approximately 23 seconds of sit time is not adequate for the second allocation of developer to achieve the desired temperature control of approximately 23° C. prior to dispensation. Conventionally, in the double puddle technique, when the second allocation of chemical developer is applied to the same wafer, the chemical developer has not achieved equilibrium with the temperature control unit, and is thus not adequately temperature controlled at dispensation.

Thus, a problem exists when the delivery of more than one temperature controlled chemical developer allocation is desired for the same wafer, as is the case in the above double puddle technique. This failure to temperature control the second allocation results in a greater difficulty in achieving the critical dimensions required.

What is needed is a device and method for improving the ability to develop a photoresist layer with a temperature controlled developer that is utilized in a double puddle technique.

SUMMARY OF THE INVENTION

Embodiments of the present invention are best understood by examining the detailed description and the appended claims with reference to the drawings. However, a brief summary of embodiments of the present invention follows.

Briefly described, an embodiment of the present invention comprises a device and a method that provides for an improved temperature control for a chemical photoresist developer. This improvement is achieved by providing for a modified heat exchanger and a modified nozzle assembly and procedure.

The modified heat exchanger assembly preferably comprises a plurality of heat exchanger tubes. The heat exchanger tubes are provided with a temperature control liquid via an input port to the heat exchanger assembly. The heat exchanger assembly then preferably utilizes a manifold device to distribute the temperature control liquid from the input port to the plurality of heat exchanger tubes. After the temperature control liquid passes through each of the plurality of heat exchanger tubes, the temperature control liquid is then collected from each of the plurality of heat exchanger tubes in an exhaust manifold, where the temperature control liquid is then exhausted via a temperature control output port. Each of the plurality of heat exchanger tubes are preferably held in place by one or more shaping clips.

The modified nozzle assembly preferably comprises inserting a temperature extension unit between a nozzle unit and a nozzle cap of a conventional nozzle assembly. By adding the temperature extension unit, a first volumetric allocation of developer may be combined with a second volumetric allocation of developer so that both may be dispensed within a relatively short period of time upon a photoresist layer surface in a temperature controlled state. By combining the first and second volumetric allocations of developer, both allocations may be adequately temperature controlled prior to the dispensation of the first allocation. At this point, the second allocation is thus already in a temperature controlled state, so that the second allocation is available when needed to be dispensed as the second portion of a double puddle development technique. By providing for temperature controlled first and second volumetric allocations of developer in a double puddle fabrication technique, the critical dimensions of a semiconductor integrated circuit device may be achieved.

Other arrangements and modifications will be understood by examining the detailed description and the appended claims with reference to the drawings.

BRIEF DESCRIPTION OF THE DRAWING

Embodiments of the present invention are described in detail herein with reference to the drawings in which.

The accompanying drawings, wherein like numerals denote like elements, are incorporated into and constitute a part of the specification, and illustrate presently preferred exemplary embodiments of the invention. However, it is understood that the drawings are for the purpose of illustration only, and are not intended as a definition of the limits of the invention. Thus, the drawings, together with the general description given above, and the detailed description of the preferred embodiments given below, together with the appended claims, serve to explain the principles of the invention.

DETAILED DESCRIPTION OF THE PREFERRED EMBODIMENT

An embodiment of the present invention is illustrated utilizing a photoresist coater and developer system. Exemplary coater and developer systems may comprise, for example, Tokyo Electron Limited ("TEL") Track models, such as the TEL MARK VII, the TEL MARK VIII, and the TEL ACT 8 models. These exemplary systems include systems that utilize a chemically amplified resist ("CAR") in the deep ultraviolet ("DUV") process that has been adopted for the sub-half micron design rule type circuit devices.

Figure 3:
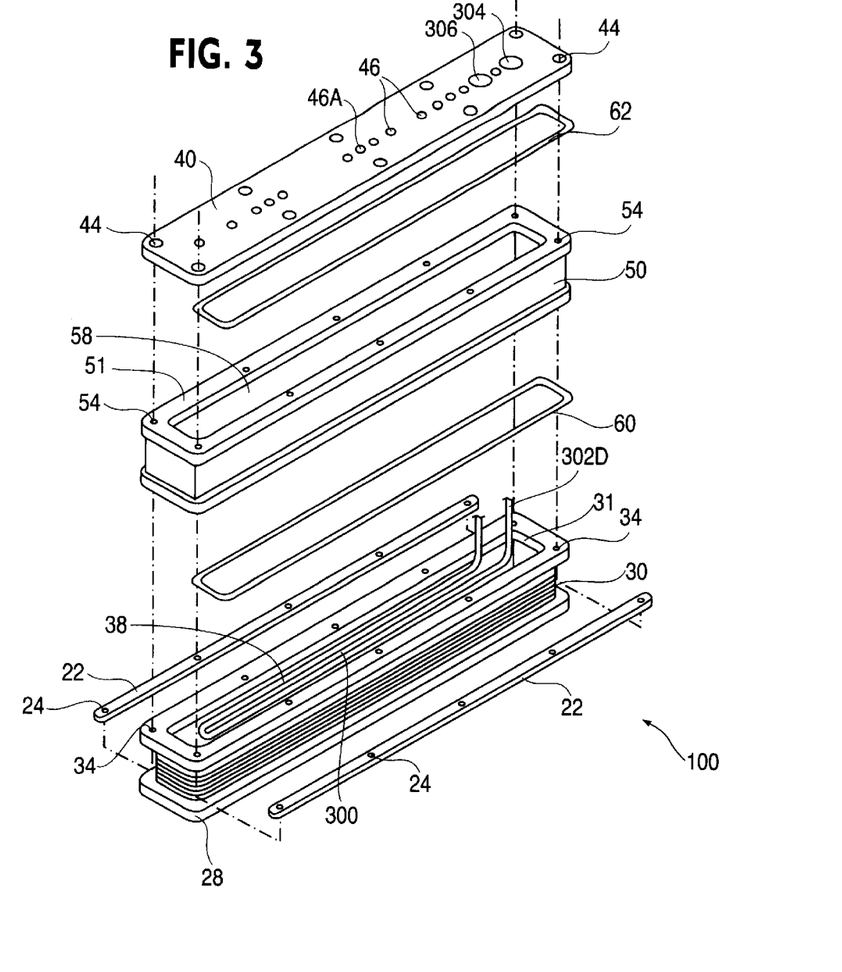
FIG. 3 illustrates an exploded view of a portion of a nozzle that is utilized in the fabrication of an integrated circuit device, in accordance with the principles of an embodiment of the present invention.
Figure 4A:
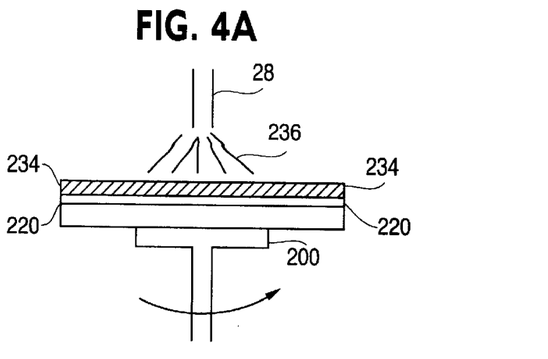
FIG. 4A illustrates a portion of a nozzle and wafer during a spray and rotation phase that is utilized in the fabrication of an integrated circuit device, in accordance with the principles of an embodiment of the present invention.
Figure 4B:
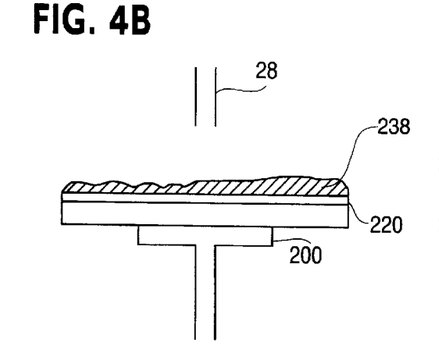
FIG. 4B illustrates a portion of a nozzle and wafer during a puddle phase that is utilized in the fabrication of an integrated circuit device, in accordance with the principles of an embodiment of the present invention.
Figure 5:
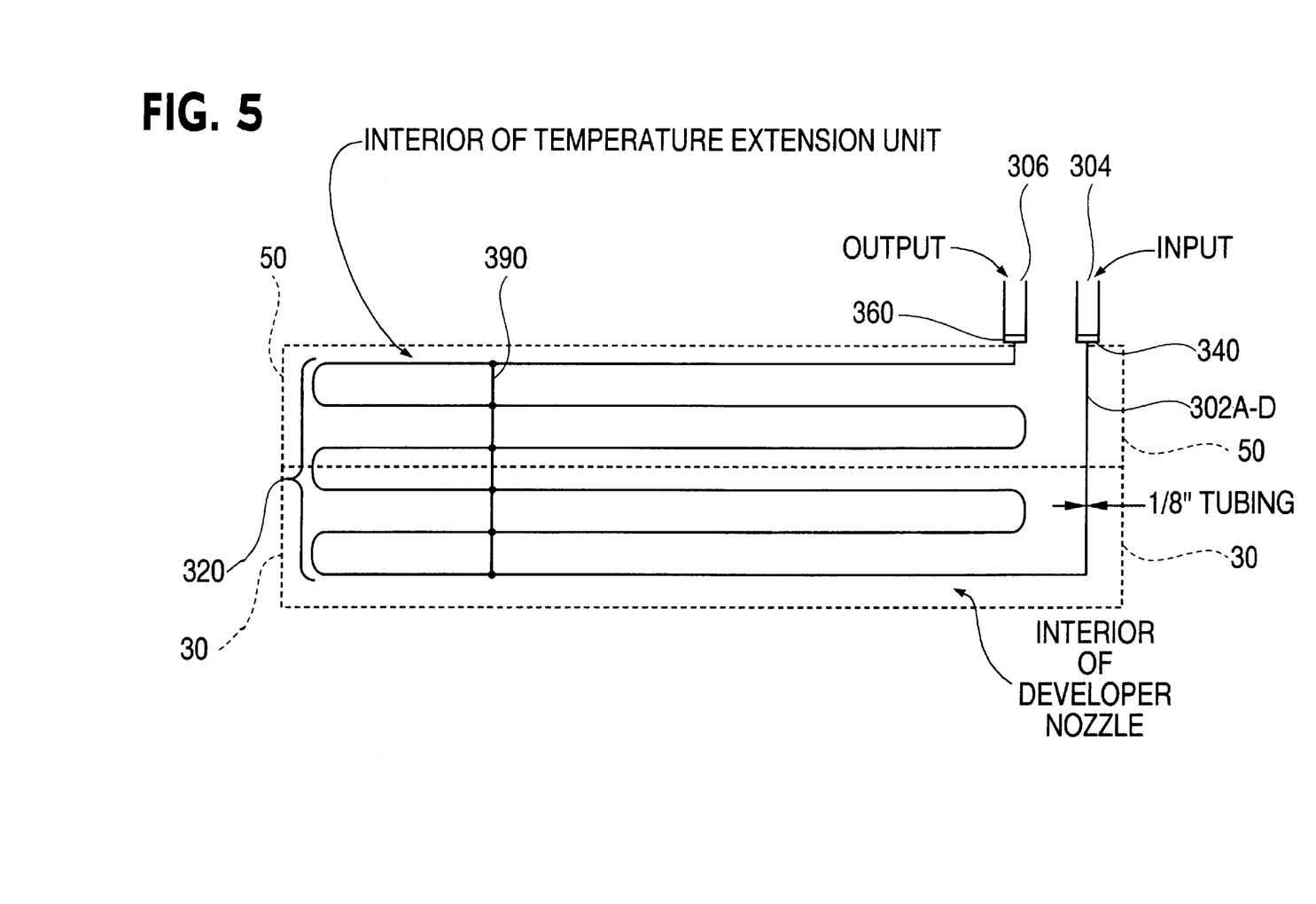
FIG. 5 illustration a side view of a portion of a heat exchanger tube assembly of FIG. 3 that is utilized in the fabrication of an integrated circuit device, in accordance with the principles of embodiment of the present invention.
Figure 6:
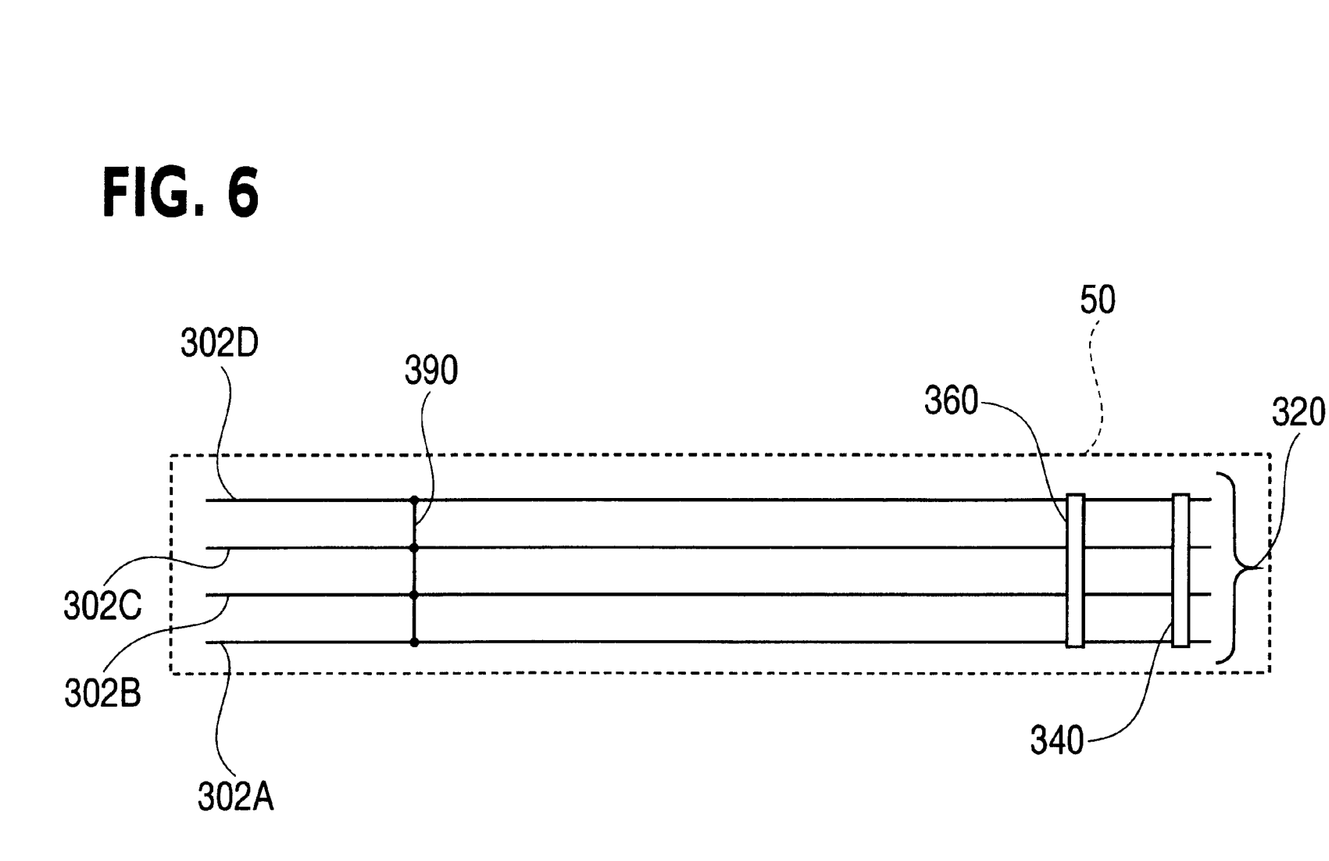
FIG. 6 illustrates a top view of a portion of a heat exchanger tube assembly of FIG. 3 that is utilized in the fabrication of an integrated circuit device, in accordance with the principles of an embodiment of the present invention.

Specifically, FIG. 3 illustrates an exemplary embodiment of the present invention that comprises an improved nozzle assembly 100 that is adaptable to a TEL MARK VIII E2 nozzle assembly. FIGS. 4A–B illustrate a double puddle chemical developer deposition technique for developing a semiconductor wafer. FIGS. 5–6 illustrate an arrangement of a heat exchanger assembly 320 that is utilized with the improved nozzle assembly 100 as shown in FIG. 3.

An example of integrated circuits that embodiments of the present invention may be utilized with are non-volatile memory integrated circuits. Also, as is clear from the detailed description herein, together with the drawings, embodiments of the present invention may be utilized with, e.g., current CMOS fabrication processes.

FIGS. 3–6 illustrate various techniques in the practice of an embodiment of the present invention. It will be understood by one skilled in the art that various components of the present invention as illustrated in FIGS. 3–6 are not shown in order to simplify the illustrations. Specifically, a portion of a photolithography fabrication process that is utilized to pattern a semiconductor wafer is described below.

FIG. 3 illustrates an embodiment of the present invention that comprises a photoresist chemical developer solution dispensing apparatus or nozzle assembly 100. The nozzle assembly 100 comprises a nozzle unit 30, a nozzle cap 40, and a temperature extension unit 50 that is provided between the nozzle cap 40 and the nozzle unit 30. The temperature extension unit 50 comprises a resilient material, e.g., such as Teflon.® The nozzle unit 30, nozzle cap 40, and temperature extension unit 50 are physically connected together by utilizing fastening devices, e.g., nuts and bolts, that are not shown. The fastening devices first pass through the fastening holes 24, starting from a lower surface of the nut plate 22, then through the fastening holes 34 of the nozzle unit 30, through the fastening holes 54 of the temperature extension unit 50, and finally through the fastening holes 44 of the nozzle cap 40.

In order to seal the nozzle assembly 100, a first 0 ring 60 is provided between the temperature extension unit 50 and the top interior recessed groove 31 of the nozzle unit 30. Also, a second O ring 62 is provided between the temperature extension unit 50 and the nozzle cap 40.

Although not shown, a plurality of nozzle ports 28 for dispensing a photoresist chemical developer solution are located on a lower portion or underside of the nozzle unit 30. The chemical developer is introduced into the nozzle assembly 100 through one or more input ports 46 of the nozzle cap 40.

As shown in FIG. 3, a temperature control unit 300, e.g., a heat exchanger tube assembly 320 is placed within thee nozzle unit interior 38. This heat exchanger assembly 320 carries a temperature control liquid within an interior sealed portion of this heat exchanger tube assembly 320. Thus, the developer temperature is controlled by the temperature control unit 300 by utilizing this heat exchanger tube assembly 320 in contact with the developer.

As shown in more detail in FIGS. 5 and 6, the heat exchanger tube assembly 320 preferably comprises a plurality of heat exchanger tubes 302A–D. Specifically, the heat exchanger tube assembly 320, as shown in FIGS. 5–6, comprises four separate heat exchanger tubes 302A–D. Each of the plurality of heat exchanger tubes 302A–D preferably comprise an approximately ⅛ inch diameter tubing. The tubing, for example, may comprise a Teflon®-like material.

Suitable temperature control unit input and output ports 304, 306, are respectively provided to transport the temperature controlled fluid into the heat exchanger tube assembly 320. The temperature control liquid achieves a thermal equilibrium with the allocation of chemical developer that has just been introduced via the developer input ports 46, into the nozzle unit interior 38 of the nozzle unit 30, as well as the temperature extension unit 50. Also provided is an air bleed port 46A that is routed to a drain that is not shown. The air bleed port 46A is utilized, e.g., when first introducing the developer.

As shown in FIGS. 5–6, the temperature controlled fluid input port 304 provides the temperature controlled fluid to an input manifold 340. The input manifold 340 distributes the temperature controlled fluid among the four heat exchanger tubes 302A–D. Each heat exchanger tube 302A–D then provides a unique or separate path, as shown in FIGS. 5 and 6 from the input manifold 340 to the output manifold 360. The output manifold 360 collects the temperature controlled fluid from each of the four heat exchanger tubes 302A–D and then exhausts the temperature controlled fluid via the output port 306.

As shown in FIGS. 5–6, the heat exchanger tube assembly 320 is contained within both the nozzle unit 30, and the temperature extension unit 50. This improved heat exchanger assembly 320 thus may achieve an improved temperature control of the chemical developer located essentially throughout the entire cavity formed by the interior of the nozzle unit 30 and the temperature extension unit 50. For example, a more effective temperature control is provided to the chemical developer than would be possible by utilizing the heat exchanger tube 302 of FIG. 1 in combination with the temperature extension unit 50. Thus, a more effective temperature control may be achieved by utilizing the improved heat exchanger tube assembly 320 in combination with the temperature extension unit 50 than might be achieved by utilizing the temperature extension unit 50 alone.

It is also understood that the heat exchanger tube assembly 320 provides for an improved temperature control of the chemical developer as compared to the prior art heat exchanger tube 302 of FIG. 1. In an embodiment of the present invention, for example, by utilizing a smaller diameter tube with a substantially longer length between the input and output ports 304, 306, an increased surface area contact between the heat exchanger tube surfaces and the chemical developer is achieved. Thus, embodiments of the present invention may achieve thermal equilibrium more rapidly than was possible in the prior art as shown in FIG. 1.

Also, thermal equilibrium may be achieved more rapidly by extending the heat exchanger, as shown in FIGS. 5–6, into the temperature extension unit 50 so as to provide an improved temperature control of the chemical developer in both the nozzle unit 30, as well as the temperature extension unit 50 as illustrated in FIGS. 4–6.

Also, as shown in FIGS. 5–6, a shaping clip 390 is utilized to provide a relative separation of the plurality of heat exchanger tubes 302A–D. As shown in FIGS. 5–6, the same shaping clip 390 may also be utilized to provide both a horizontal separation between the plurality of heat exchanger tubes 302A–D, and a vertical separation between the multiple loops of a specific heat exchanger tube, for example, heat exchanger tube 302A as shown in FIG. 5.

Alternately, a plurality of shaping clips 390 may be utilized to provide either or both the horizontal and vertical separation. The horizontal and vertical separation may alternatively be accomplished by utilizing separate shaping clips, or similar devices. The shaping clip 390 may comprise, for example, a molded plastic clip-like device.

By providing this close physical association between the temperature control unit and the chemical developer nozzle ports 28, a relatively strict or precise temperature control of both the first and second developer allocations is achieved. The temperature control of the chemical developer is provided until it is dispensed or deposited by the nozzle ports 28 onto the wafer 220, as is shown in FIGS. 4A–B.

In FIG. 4A, a photoresist coating and developing system that utilizes a double puddle technique is shown. Specifically, a double puddle process that is utilized in the practice of an embodiment of the present invention comprises the following technique that is illustrated by a single wafer spray unit.

In FIG. 4A, the semiconductor wafer 220 is held upon a rotatable table or track chuck 200. First, the wafer 220 is spun utilizing the chuck 200. A first volumetric allocation of the temperature controlled photoresist chemical developer 236 is dispensed through the nozzle ports 28 to an upper surface of the wafer 220 that further comprises a photoresist layer 234 that has been patterned and exposed by light. While the temperature controlled chemical developer 236 is being dispensed, the wafer 220 is spun at a relatively low RPM. The chemical developer 236 is now utilized to cure the photoresist.

The spinning of the wafer 220 is then stopped, as shown in FIG. 4B. The first allocation of the chemical developer 236 has been deposited by the nozzle ports 28 so as to cover the photoresist upper surface. Surface tension now holds the developer 236 on the wafer 220 so as to form a puddle 238. The puddle 238 of developer 236 then sits upon the surface of the wafer 220 for a first specified or required period of time. For example, a first specified sit time of approximately 23 seconds may be utilized. This sit time may vary depending upon the type of photoresist and/or developer utilized and/or the size of the wafer to be developed. For example, each sit time may vary from about 15 seconds to about 30 seconds or more.

When the first specified sit time has expired, the wafer 220 is again spun at a relatively low RPM while a second volumetric allocation of the temperature controlled developer 236 is dispensed by the nozzle ports 28 onto the wafer 220. Again, the wafer spinning is stopped and the wafer 220 is again allowed to sit with a puddle 238 of the second allocation of developer 236, e.g., for a second sit time of approximately another 23 seconds. Again, e.g., each sit time may vary from about 15 seconds to about 30 seconds or more.

Finally, the wafer 220 is spun at a relatively high RPM while rinsing, e.g., with water. After rinsing, the wafer 220 is dried and passed on to the next step. It is understood that the rinsing and drying portions of the developing process are not illustrated in FIGS. 4A–B. Also, it is understood that the chuck 200 may be utilized to heat the wafer 220 in each of the puddle steps, thereby either accelerating or causing the development of the photoresist to take place. The next wafer is then processed through the development station.

The above described first and second allocations and sit times of the developer 236 comprise a preferred double puddle technique. Each new wafer is processed through this double puddle development in about two to three minutes, e.g. 2.5 minutes.

Volumetrically, the improved nozzle assembly 100, that comprises the nozzle unit 30 and the temperature extension unit 50, temperature controls approximately 120 cubic centimeters (cc's) of developer at any given time, once the developer reaches an approximate thermal equilibrium with the heating unit. The first allocation of the temperature controlled chemical developer 236 utilizes approximately one-half of this 120 cc volume. Also, prior to the first dispensing, the second allocation of the temperature controlled chemical developer 236 utilizes approximately the remaining one-half of this 120 cc volume that is contained in the improved nozzle assembly 100. Because both allocations of developer 236 are able to achieve an approximate thermal equilibrium with the heating unit in the nozzle assembly 100 prior to dispensation of the first allocation, the first and second allocations of developer 236 are initially both optimally temperature controlled.

Further, after the first dispensation but prior to the second dispensation, the second allocation is now also able to achieve an adequate temperature control prior to dispensation. Specifically, as the first allocation is dispensed, the volume of developer that is being dispensed is constantly being replaced with an equivalent volume of developer via the input ports 46, as shown in FIG. 3. This volumetric replacement occurs because the developer is under a constant pressure. This constant volumetric replacement causes a significant amount of the second 60 cc portion of the initially temperature controlled developer to tend to move towards the nozzles, so as to replace the first portion of developer that is being dispensed. Similarly, as the second portion or allocation moves toward the nozzles, it is also, in turn, volumetrically replaced with non-temperature controlled developer supplied via the input ports 46.

Thus, at least a portion of the second 60 cc allocation, that was temperature controlled prior to the first dispensing, is essentially moved closer to the nozzle ports. In other words, the next or second portion of developer that will be dispensed has moved to and is primarily located nearest the nozzle ports, after the first dispensing has been completed. Because a significant portion of this next 60 cc volume to be dispensed has already been temperature controlled once, it requires less time for the 60 cc portion nearest the nozzle ports to reach an adequately temperature controlled state. This adequately temperature controlled state may comprise a temperature of approximately 23° C., or at least a temperature that is close enough to approximately 23° C., so that the developer performance is improved, as compared to the conventional apparatus and method previously described.

Thus, the time required before the second allocation of approximately 60 cc can be dispensed in an adequate temperature controlled state is reduced. Generally, an adequately temperature controlled second allocation of developer may be made available for dispensing within the desired time frame of approximately 23 seconds.

Further, some of the various embodiments of the present invention comprise an improved heat exchanger. In these embodiments, a temperature control of, e.g., a 60 cc potion of developer may be more easily achieved, and in substantially less time that the currently desired time frame of approximately 23 seconds.

Also, various embodiments of the present invention comprise an improved heat exchanger, and also may comprise, e.g., a 180 cc temperature extension unit, preferably with a heat exchanger of the present invention fully extended beyond the existing nozzle unit 30, so as to also be fully within the 180 cc temperature extension unit, similar to the embodiment illustrated in FIGS. 5–6. In these embodiments, a temperature control of, e.g., a 120 cc portion of developer may be more easily achieved, and may alternatively be achieved within the currently desired time frame of approximately 23 seconds, or in even less time. This is particularly beneficial for processing wafers that are larger that the currently preferred 8 inch diameter wafers, because more developer is required as the diameter of the wafer to be developed is increased. Thus, various embodiments of the present invention may be utilized to process substantially larger diameter wafers, e.g., approximately 9, 10, 11, 12, 13, 14, 15, or 16 inch diameter wafers, or even larger wafers.

As illustrated in FIGS. 4–6, the improved nozzle assembly 100 thus allows for the delivery of more than one portion of the temperature controlled chemical developer allocation for the same wafer, as is illustrated in the above double puddle technique. This achievement of temperature control of the second allocation of developer results in a greater ability to achieve the critical dimensions required.

For example, the first allocation of developer is dispensed in a temperature controlled manner. However, after developing or "sitting" for a short period of time, the developer tends to "wear out." Thus, in order to achieve the sub-half micron dimensions of the semiconductor integrated circuit device, a second puddle of temperature controlled developer is applied, relatively soon after the first temperature controlled puddle. By adequately temperature controlling the second developer puddle deposition, the critical dimensions may be easily achieved because of an improved quality of the actions of the second developer puddle.

Thus, the temperature control required to achieve the critical dimensions desired in the fabrication of the semiconductor integrated circuit devices may be realized.

Also, the volume of the temperature extension unit 50 has been primarily described as being approximately the same as the volume of the nozzle unit 30. However, it is understood that the volume of the temperature extension unit 50 may alternately be more or less than the volume of the nozzle unit 30. For example, and preferably in combination with an improved heat exchanger of the present invention, the temperature extension unit 50 may be between approximately ¼ to 4 times the volume of the nozzle unit 30. Preferably, the temperature control unit 50 may be between approximately ¼ to 2 times the volume, or most preferably about the same volume size as the nozzle unit 30.

Figure 7:
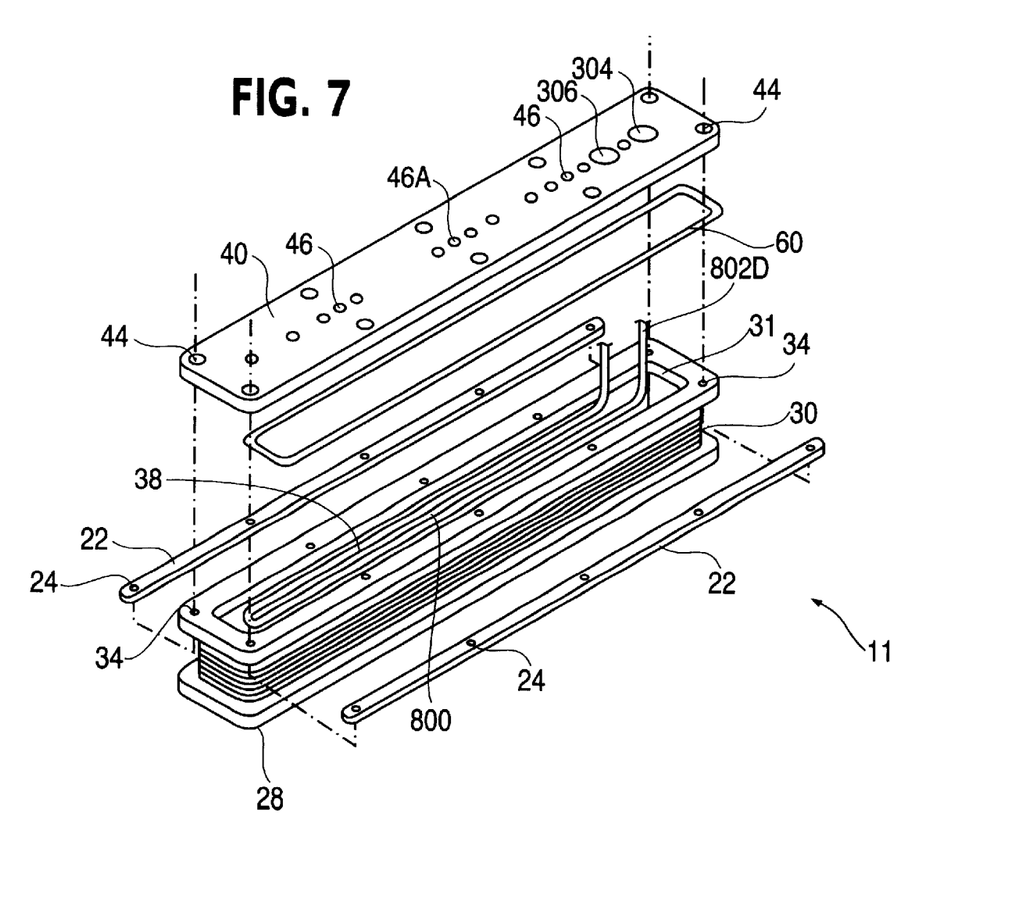
FIG. 7 illustrates an exploded view of a portion of a nozzle that is utilized in the fabrication of an integrated circuit device, in accordance with the principles of an embodiment of the present invention.
Figure 8:
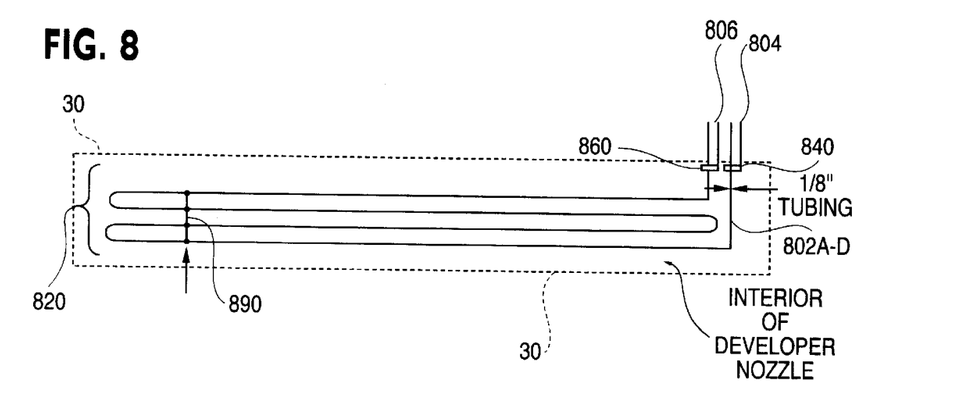
FIG. 8 illustrates a side view of a portion of a heat exchanger tube assembly of FIG. 7 that is utilized in the fabrication of an integrated circuit device, in accordance with the principles of an embodiment of the present invention.
Figure 9:
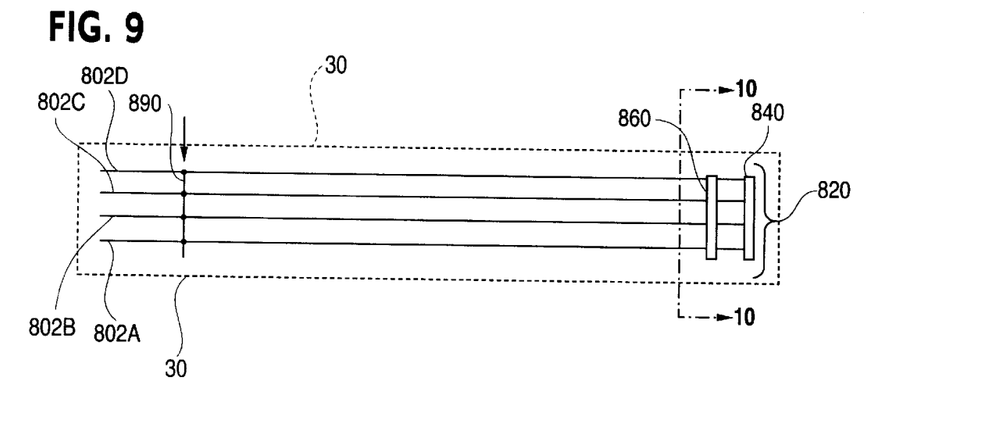
FIG. 9 illustrates a top view of a portion of a heat exchanger tube assembly of FIG. 7 that is utilized in the fabrication of an integrated circuit device, in accordance with the principles of an embodiment of the present invention.
Figure 10:
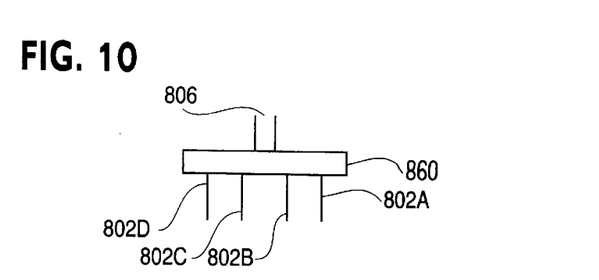
FIG. 10 illustrates a cross-sectional view of a portion of a heat exchanger tube assembly of FIG. 9, that is taken along line 10—10, and that is utilized in the fabrication of an integrated circuit device, in accordance with the principles of an embodiment of the present invention.

Next, FIG. 7 illustrates another exemplary embodiment of the present invention that comprises a nozzle assembly 11 that is adaptable to a TEL MARK VIII E2 nozzle assembly utilizing a preexisting integrated single reservoir, e.g., a standard reservoir comprising the original reservoir as supplied, or a reasonable facsimile thereof to the original equipment as shown in FIG. 7. FIGS. 8–10 illustrate another arrangement of a heat exchanger assembly 820 that is utilized with the improved nozzle assembly 11 as shown in FIG. 7.

Specifically, the nozzle assembly 11 as illustrated in FIG. 7, is essentially the same as the nozzle assembly 10 that has been described with reference to FIG. 1. However, in FIG. 7, an embodiment of the present invention comprises an improved heat exchanger assembly 820. In FIG. 7, only one heat exchanger tubes 802D of a plurality of heat exchanger tubes 802A–D is illustrated in FIG. 7. The improved heat exchanger assembly 820 and the plurality of heat exchanger tubes 802A–D are more clearly illustrated in FIGS. 8–10.

As shown in more detail in FIGS. 8–10, the heat exchanger tube assembly 820 preferably comprises a plurality of heat exchanger tubes 802A–D. Specifically, the heat exchanger tube assembly 820, as shown in FIGS. 8–10, comprises four separate heat exchanger tubes 802A–D. Each of the plurality of heat exchanger tubes 802A–D preferably comprise an approximately ⅛ inch diameter tubing. The tubing, for example, may comprise a Teflon®-like material.

Suitable temperature control unit input and output ports 804, 806, are respectively provided to transport the temperature controlled fluid into the heat exchanger tube assembly 820. The temperature control liquid achieves a thermal equilibrium with the allocation of chemical developer that has just been introduced via the developer input ports 46, into the nozzle unit interior 38 of the nozzle unit 30. As shown in FIG. 7, an air bleed port 46A is also provided, that is routed to a drain that is not shown. The air bleed port 46A is utilized, e.g., when first introducing the developer.

As shown in FIGS. 8–10, the temperature controlled fluid input port 804 provides the temperature controlled fluid to an input manifold 840. The input manifold 840 distributes the temperature controlled fluid among the four heat exchanger tubes 802A–D. Each heat exchanger tube 802A–D then provides a unique or separate path, as shown in FIGS. 8 and 9, from the input manifold 840 to the output manifold 860. The output manifold 860 collects the temperature controlled fluid from each of the four heat exchanger tubes 802A–D and then exhausts the temperature controlled fluid via the output port 806. The output manifold 860 is more clearly illustrated in FIG. 10. Also, the input manifold 840 is preferably analogous to the output manifold 860.

As shown in FIGS. 8–10, the heat exchanger tube assembly 820 is contained within the nozzle unit 30. This improved heat exchanger assembly 820 thus may achieve an improved temperature control of the chemical developer located essentially throughout the entire cavity formed by the interior of the nozzle unit 30. It is also understood that the heat exchanger tube assembly 820 provides for an improved temperature control of the chemical developer as compared to the prior art heat exchanger tube 302 of FIG. 1. In an embodiment of the present invention, for example, by utilizing a smaller diameter tube with a substantially longer length between the input and output ports 804, 806, an increased surface area contact between the heat exchanger tube surfaces and the chemical developer is achieved. Thus, embodiments of the present invention may achieve thermal equilibrium more rapidly than was possible in the prior art as shown in FIG. 1.

Also, as shown in FIGS. 8–9, a shaping clip 890 is utilized to provide a relative separation of the plurality of heat exchanger tubes 802A–D. As shown in FIGS. 8–9, the same shaping clip 890 may also be utilized to provide both a horizontal separation between the plurality of heat exchanger tubes 802A–D, and a vertical separation between the multiple loops of a specific heat exchanger tube, for example, heat exchanger tube 802A as shown in FIGS. 8–9.

Alternately, a plurality of shaping clips 890 may be utilized to provide either or both the horizontal and vertical separation. The horizontal and vertical separation may alternatively be accomplished by utilizing separate shaping clips, or similar devices. The shaping clip 890 may comprise, for example, a molded plastic clip-like device.

In summary, it is also understood that by utilizing embodiments of this improved heat exchanger tube assembly 320 in combination with the temperature extension unit 50, that a number of benefits may be achieved. First, in a typical arrangement, the wafers 220 as shown in FIGS. 4A–B are typically approximately 8 inches in diameter. However, with embodiments comprising a combination of the heat exchanger tube assembly 320 and the temperature extension unit 50, embodiments of the present invention may be utilized to provide an adequate temperature controlled chemical developer for wafers that exceed 8 inches in diameter. For example, a wafer of 12 inches in diameter may be utilized in the fabrication of semi-conductor devices by utilizing this combined arrangement. In this 12 inch wafer arrangement, the temperature extension unit 50 may be enlarged to, for example, 120 cc in volume. In yet other embodiments, the total developer volume that is contained in the nozzle unit 30 and the temperature extension unit 50 may, for example, be as much as 300 cc in volume, or even greater.

This increased volume of chemical developer may be achieved by the heat exchanger tube assembly 320 being further enlarged in various alternate embodiments, such that each of the heat exchanger tubes 302A–D have, for example, an increased number of loops and/or an increased run length between the input port manifold 340 and the output manifold 360. These alternate embodiments may provide, e.g., for an increased heat exchanger to developer contact surface area. Thus, an improved temperature control of the chemical developer by utilizing the temperature controlled fluid within the heat exchanger tubes 302A–D, provides for an improved temperature controlled chemical developer dispensation to the wafer, even when the wafer is increased in diameter size.

The invention has been described in reference to particular embodiments as set forth above. However, only the preferred embodiment of the present invention, and but a few examples of its versatility are shown and described in the present disclosure. It is understood that the present invention is capable of use in various other combinations and environments, and is capable of changes or modifications within the scope of the inventive concept as expressed herein. Also, many modifications and alternatives will become apparent to one of skill in the art without departing from the principles of the invention as defined by the appended claims.

What is claimed is:

1. A semiconductor developer nozzle apparatus, utilizing a preexisting integrated single reservoir, comprising:
   a temperature controlled developer reservoir, and
   a temperature controlled developer dispenser,
   a heat exchanger unit for providing a temperature control for a temperature controlled first and second portions of developing, wherein
      the temperature controlled developer dispenser is utilized for dispensing the temperature controlled first and second portions of developer,
      the temperature controlled first and second portions of developer are obtained from the temperature controlled developer r reservoir, after the dispensing of the temperature controlled first portion of developer, the temperature controlled second portion of developer is temperature controlled and contained by the temperature controlled developer reservoir, wherein
the heat exchanger assembly is located adjacent to at least a part of at least one of the first and second portions of developer; wherein
the heat exchanger assembly occupies a portion of an internal volume defined by the temperature controlling developer dispensing reservoir, and wherein
the heat exchanger assembly comprises a plurality of heat exchanger conduits;
a temperature controlled fluid is provided to the plurality of heat exchanger conduits via an inlet manifold, and
the temperature controlled fluid is exhausted from the plurality of heat exchanger conduits via an outlet manifold.

2. An apparatus as recited in claim 1, wherein
the temperature controlled first and second portions of developer are dispensed while constantly refilling the temperature controlled developer reservoir.

3. An apparatus as recited in claim 1, wherein
the temperature controlled first and second portions of developer are dispensed within approximately 30 seconds of each other.

4. An apparatus as recited in claim 3, wherein
the dispensing of the temperature controlled first and second portions of developer are repeated at periodic intervals of within approximately three minutes.

5. An apparatus as recited in claim 1, wherein
the temperature controlled first and second portions of developer are utilized to develop a photoresist that has been exposed by a deep ultraviolet process.

6. An apparatus as recited in claim 1, wherein
the second portion is approximately the same volume as the first portion.

7. An apparatus as recited in claim 1, wherein
the volume of each of the first and second portions is between approximately 30 and 120 cubic centimeters.

8. An apparatus as recited in claim 1, wherein
the volume of each of the first and second portions is approximately 60 cubic centimeters.

9. A device for dispensing a temperature controlled photoresist developer, utilizing a preexisting integrated single reservoir, comprising:
a dispensing nozzle unit,
a temperature control device comprising a plurality of heat exchanger conduits, for controlling a first portion of developer together with a second portion of developer, wherein
after a dispensing of the temperature controlled first portion of developer, the temperature controlled second portion of developer is temperature controlled by the temperature control device for temperature controlling the first and second portions of developer, wherein
the temperature control device is located adjacent to at least a part of at least one of the first and second portions of developer; wherein
the temperature control device occupies a portion of an internal volume defined by the temperature controlling developer dispensing reservoir, and wherein
the temperature control device comprises a plurality of heat exchanger conduits; wherein a temperature controlled fluid is provided to the plurality of heat exchanger conduits via an inlet manifold, and
the temperature controlled fluid is exhausted from the plurality of heat exchanger conduits via an outlet manifold.

10. A device as recited in claim 9, wherein
the temperature controlled first and second portions of developer are dispensed within approximately 30 seconds or less of each other.

11. A device as recited in claim 10, further comprising:
the dispensing of both of the temperature controlled first and second portions of developer are repeated at periodic intervals of within approximately three minutes.

12. A device as recited in claim 9, wherein
temperature controlled first and second portions of developer are dispensed to develop a photoresist that has been exposed by a deep ultraviolet process.

13. A device as recited in claim 9, wherein
the second portion is approximately the same volume as the first portion.

14. A device as recited in claim 9, wherein
the volume of each of the first and second portions is between approximately 30 and 120 cubic centimeters.

15. A device as recited in claim 9, wherein
the volume of each of the first and second portions is approximately 60 cubic centimeters.

16. An apparatus for supplying a developer to a photoresist, utilizing a preexisting integrated single reservoir, comprising:
a developer reservoir for containing a developer that has been introduced,
a temperature controlling heat exchanger device operating with the developer reservoir to temperature control the introduced developer,
a dispensing device dispenses a first portion of the developer onto a semiconductor that has been previously coated with a photoresist and patterned, the first portion being approximately all of the reservoir volume, wherein
simultaneous with the dispensing of the first portion of developer, additional developer is introduced into the reservoir approximately sufficient to replace the dispensed first portion of developer, wherein
the temperature controlling device temperature controls the remaining developer and the additional developer for a pre-set period of time, and wherein
the dispensing device dispenses a second portion of the developer onto said semiconductor,
the heat exchanger assembly is located adjacent to at least a part of at least one of the first and second portions of developer; wherein
the heat exchanger assembly occupies a portion of an internal volume defined by the temperature controlling developer dispensing reservoir, and wherein
the heat exchanger assembly comprises a plurality of heat exchanger conduits;
a temperature controlled fluid is provided to the plurality of heat exchanger conduits via an inlet manifold, and
temperature controlled fluid is exhausted from the plurality of heat exchanger conduits via an outlet manifold.

17. An apparatus as recited in claim 16, wherein
the second portion is approximately the same volume as the first portion.

18. An apparatus as recited in claim 16, wherein the volume of each of the first and second portions is between approximately 30 and 120 cubic centimeters.

19. An apparatus as recited in claim 16, wherein the volume of each of the first and second portions is approximately 60 cubic centimeters.

20. An apparatus for supplying a developer to a photoresist, utilizing a preexisting integrated single reservoir, comprising:

a preexisting integrated single reservoir is provided with a nozzle unit and a nozzle cap of a nozzle assembly, a modified heat exchanger assembly that further comprises a plurality of heat exchanger tubes, wherein a temperature control liquid is provided via an input port to the heat exchanger tubes, wherein each of the plurality of heat exchanger tubes are preferably held in place by at least one shaping clip, a manifold device that is utilized to distribute the temperature control liquid from the input port to the plurality of heat exchanger tubes, an exhaust manifold for collecting the temperature control liquid from each of the plurality of heat exchanger tubes into the exhaust manifold, after the temperature control liquid passes through each of the plurality of heat exchanger tubes, a temperature control output port for exhausting the temperature control liquid, and wherein a second volumetric allocation of developer is temperature controlled, after the dispensation of the first allocation, and wherein both allocations are dispensed within a relatively short period of time upon a semiconductor wafer photoresist layer surface in a relatively temperature controlled state.

21. An apparatus as recited in claim 20, wherein the preexisting integrated single reservoir, the nozzle unit, the nozzle unit and the nozzle cap of the nozzle assembly comprises at least a portion of a Tokyo Electron Limited® ("TEL") Track semiconductor wafer coater system.

* * * * *